(12) United States Patent
Meiser et al.

(10) Patent No.: US 9,614,032 B2
(45) Date of Patent: Apr. 4, 2017

(54) SEMICONDUCTOR DEVICE, INTEGRATED CIRCUIT AND METHOD FOR MANUFACTURING THE SEMICONDUCTOR DEVICE

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/081,423

(22) Filed: Mar. 25, 2016

(65) Prior Publication Data

US 2016/0307996 A1 Oct. 20, 2016

(30) Foreign Application Priority Data

Apr. 14, 2015 (DE) .................. 10 2015 105 679

(51) Int. Cl.
| | |
|---|---|
| *H01L 29/423* | (2006.01) |
| *H01L 29/06* | (2006.01) |
| *H01L 29/78* | (2006.01) |
| *H01L 29/45* | (2006.01) |
| *H01L 21/265* | (2006.01) |
| *H01L 29/66* | (2006.01) |
| *H01L 29/10* | (2006.01) |

(52) U.S. Cl.
CPC .... *H01L 29/0634* (2013.01); *H01L 21/26586* (2013.01); *H01L 29/0649* (2013.01); *H01L 29/1008* (2013.01); *H01L 29/4236* (2013.01); *H01L 29/45* (2013.01); *H01L 29/66719* (2013.01); *H01L 29/66734* (2013.01); *H01L 29/7813* (2013.01)

(58) Field of Classification Search
CPC ....... H01L 21/70; H01L 21/702; H01L 21/71; H01L 21/8232; H01L 29/1025
See application file for complete search history.

(56) References Cited

U.S. PATENT DOCUMENTS

| | | |
|---|---|---|
| 2007/0108469 A1 | 5/2007 | Nakano |
| 2008/0164506 A1 | 7/2008 | Leibiger |
| 2008/0261358 A1 | 10/2008 | Sonsky |

OTHER PUBLICATIONS

Office Action communication of the German Patent and Trademark Office for Appln. Ser. No. 102015105679.8, Jan. 19, 2016.

*Primary Examiner* — Cheung Lee
(74) *Attorney, Agent, or Firm* — Baker Botts L.L.P.

(57) ABSTRACT

A semiconductor device comprises a transistor in a semiconductor body having a first main surface and a second main surface, the first main surface being opposite to the second main surface. The transistor comprises a source region at the first main surface, a drain region, a body region, a drift zone, and a gate electrode at the body region. The body region and the drift zone are disposed along a first direction between the source region and the drain region, the first direction being parallel to the first main surface. The gate electrode is disposed in trenches extending in the first direction. The transistor further comprises an insulating layer adjacent to the second main surface of the body region. The source region vertically extends to the second main surface.

22 Claims, 19 Drawing Sheets

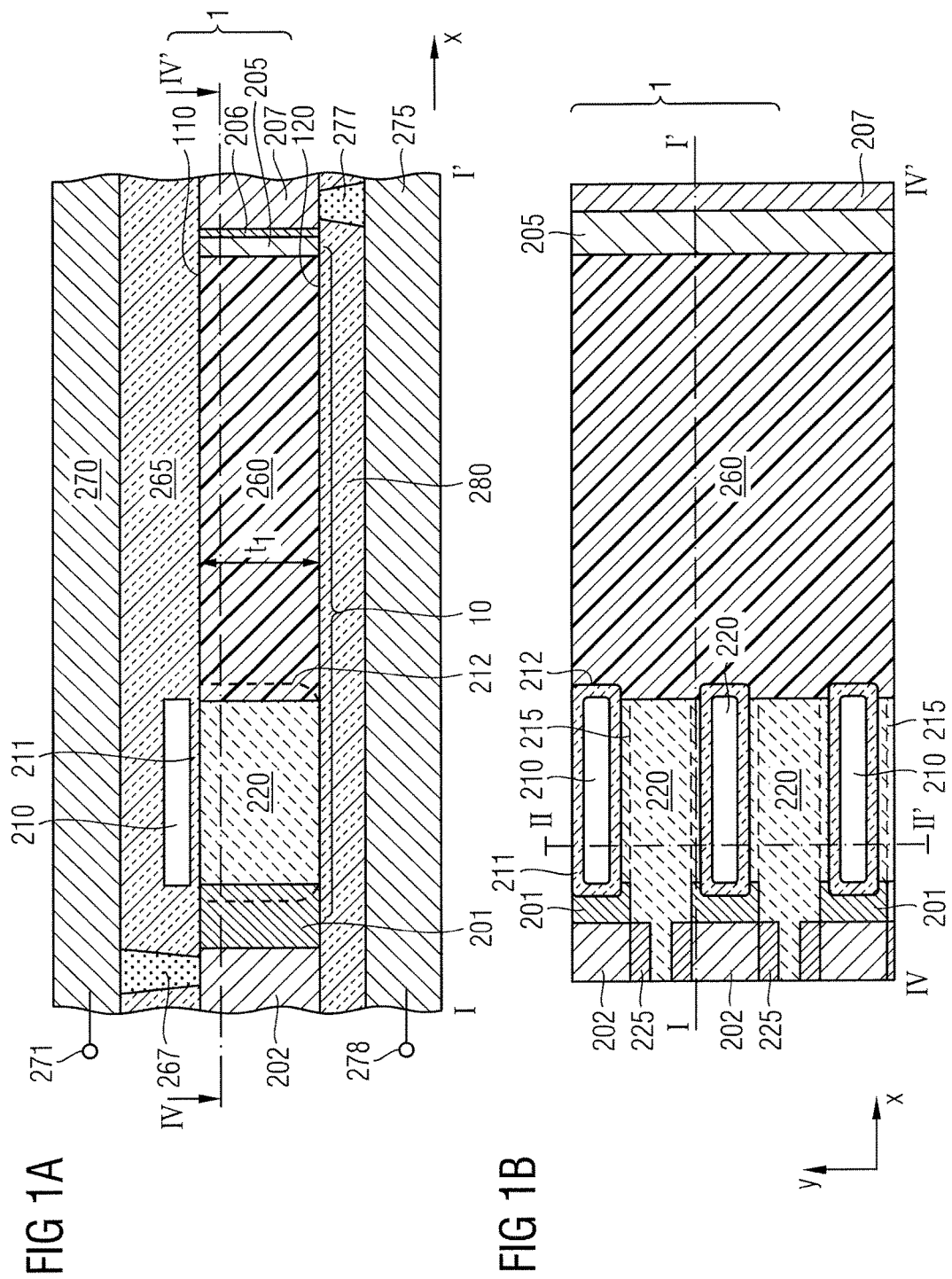

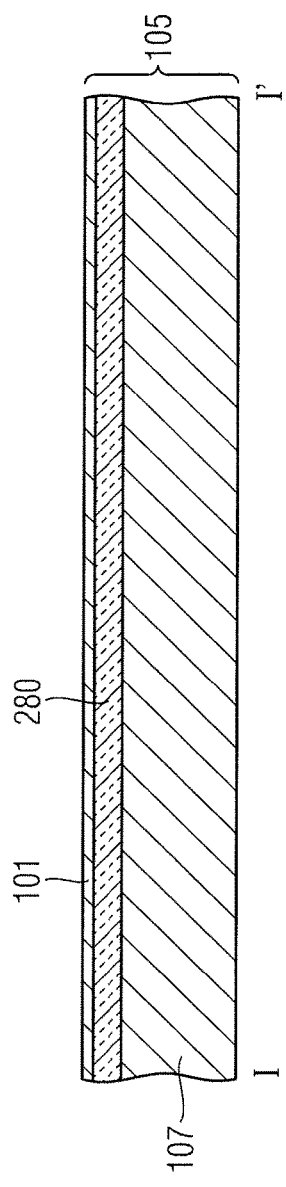
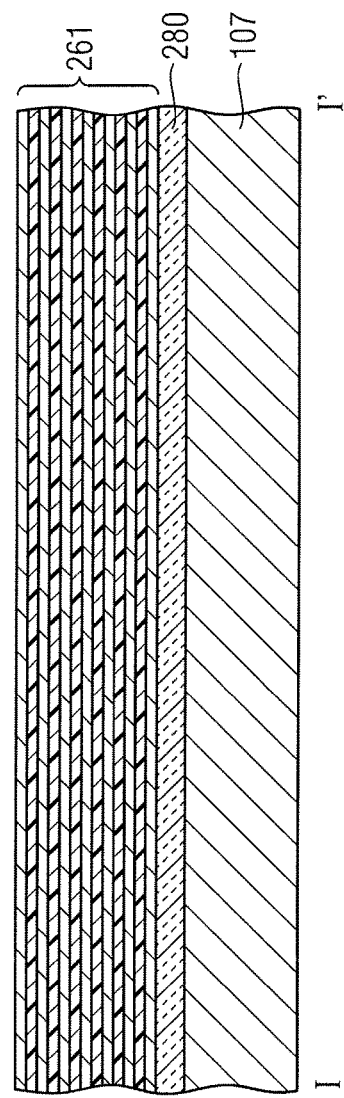

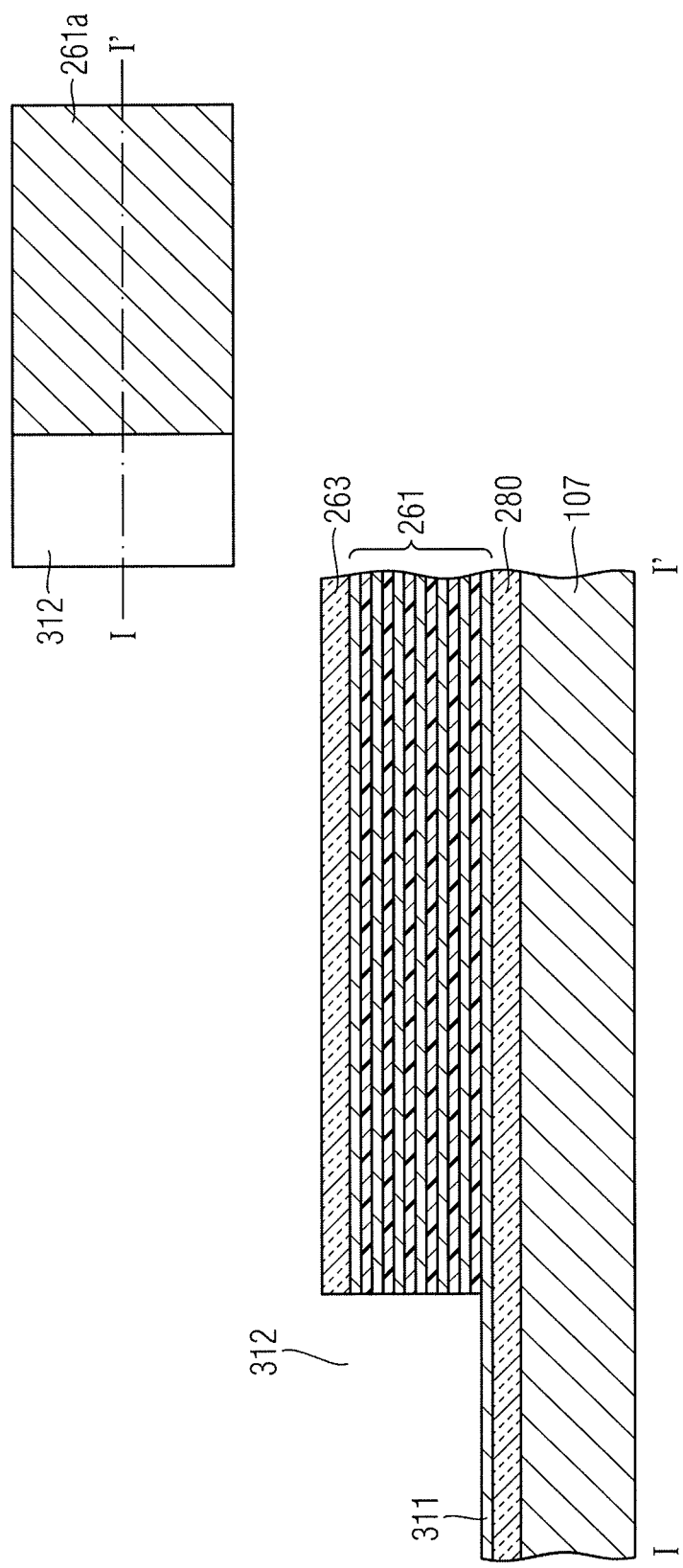

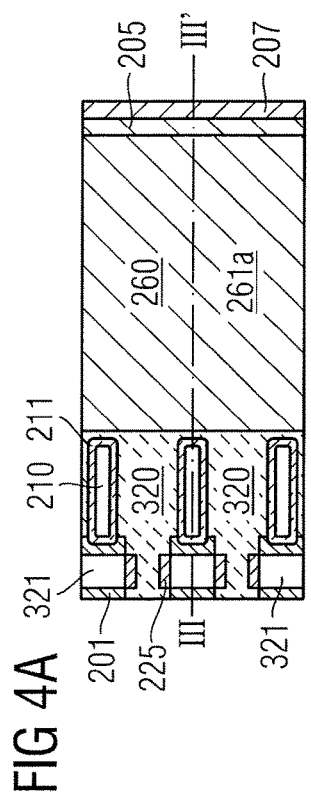
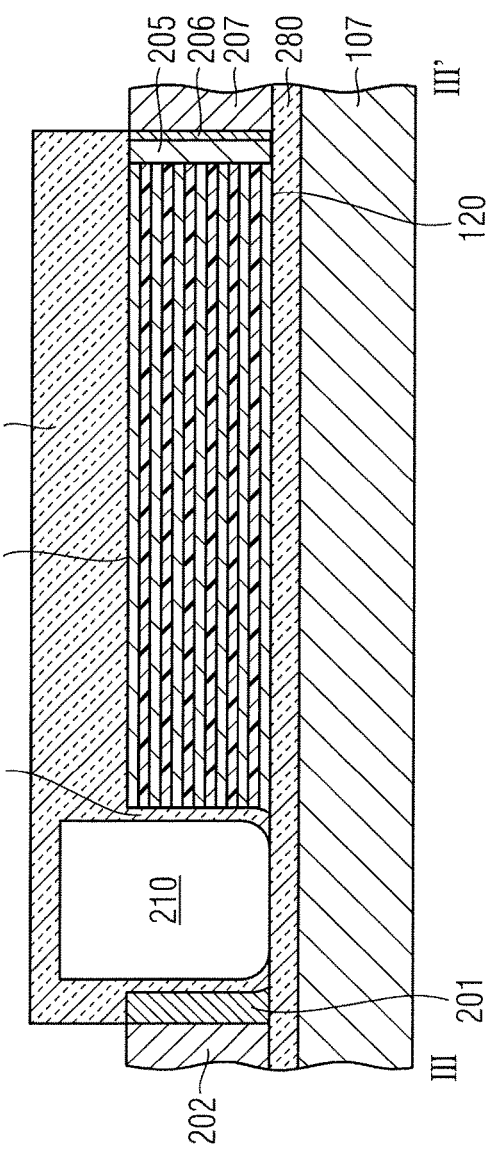
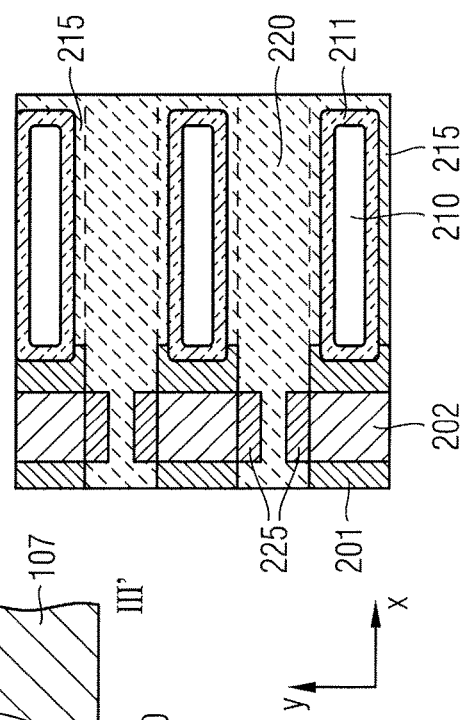

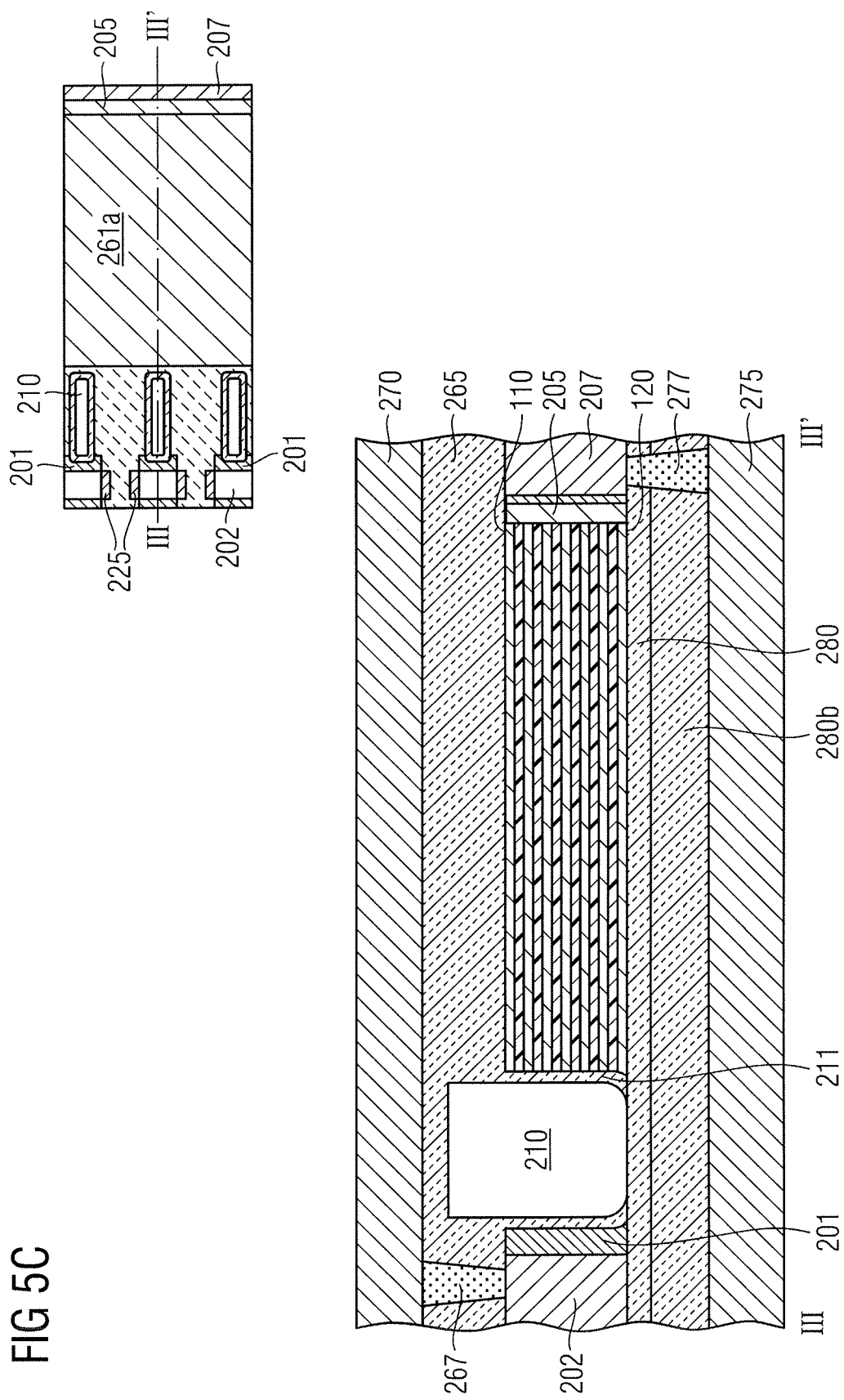

SEMICONDUCTOR DEVICE, INTEGRATED CIRCUIT AND METHOD FOR MANUFACTURING THE SEMICONDUCTOR DEVICE

CROSS-REFERENCE TO RELATED APPLICATION

This application claims priority to German Application Serial No. 102015105679.8 filed Apr. 14, 2015 and entitled "Semiconductor Device, Integrated Circuit and Method for Manufacturing the Semiconductor Device".

BACKGROUND

Power transistors commonly employed in automotive and industrial electronics should have a low on-state resistance ($R_{on} \cdot A$), while securing a high voltage blocking capability. For example, a MOS ("metal oxide semiconductor") power transistor should be capable, depending upon application requirements to block drain to source voltages $V_{ds}$ of some tens to some hundreds or thousands volts. MOS power transistors typically conduct very large currents which may be up to some hundreds of amperes at typical gate-source voltages of about 2 to 20 V.

Compensation devices have been used in a voltage region of 200 to 800 V. In these compensation devices, the drift zone is implemented by a plurality of semiconductor layers having different conductivity types. Generally, new concepts of vertical power devices are being developed.

It is an object of the present invention to provide a semiconductor device comprising a transistor having improved properties.

SUMMARY

According to an embodiment, a semiconductor device comprises a transistor in a semiconductor body having a first main surface and a second main surface, the first main surface being opposite to the second main surface. The transistor comprises a source region at the first main surface and extending to the second main surface, a drain region, a body region, a drift zone, and a gate electrode at the body region. The body region and the drift zone are disposed along a first direction between the source region and the drain region, the first direction being parallel to the first main surface. The gate electrode is disposed in trenches extending in the first direction. The semiconductor device further comprises an insulating layer adjacent to the second main surface of the semiconductor body.

According to an embodiment, a method of manufacturing a semiconductor device comprising a transistor in a semiconductor body having a first main surface and a second main surface, the first main surface being opposite to the second main surface comprises forming a source region at the first main surface, the source region extending to the second main surface, forming a drain region, forming a body region, forming a drift zone, and forming a gate electrode at the body region, the body region and the drift zone being disposed along a first direction between the source region and the drain region, the first direction being parallel to the first main surface. Forming the gate electrode comprises forming trenches extending in the first direction. The method further comprises forming an insulating layer adjacent to the second main surface of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a cross-sectional view of a semiconductor device according to an embodiment;

FIG. 1B shows a horizontal cross-sectional view of the semiconductor device;

FIGS. 3A to 3I illustrate cross-sectional views of a substrate when performing the method according to an embodiment.

FIGS. 4A to 4C illustrate various viewings of a substrate after performing a certain processing step.

FIGS. 5A to 5D illustrate a method when performing further processing steps.

DETAILED DESCRIPTION

Figure 1C:
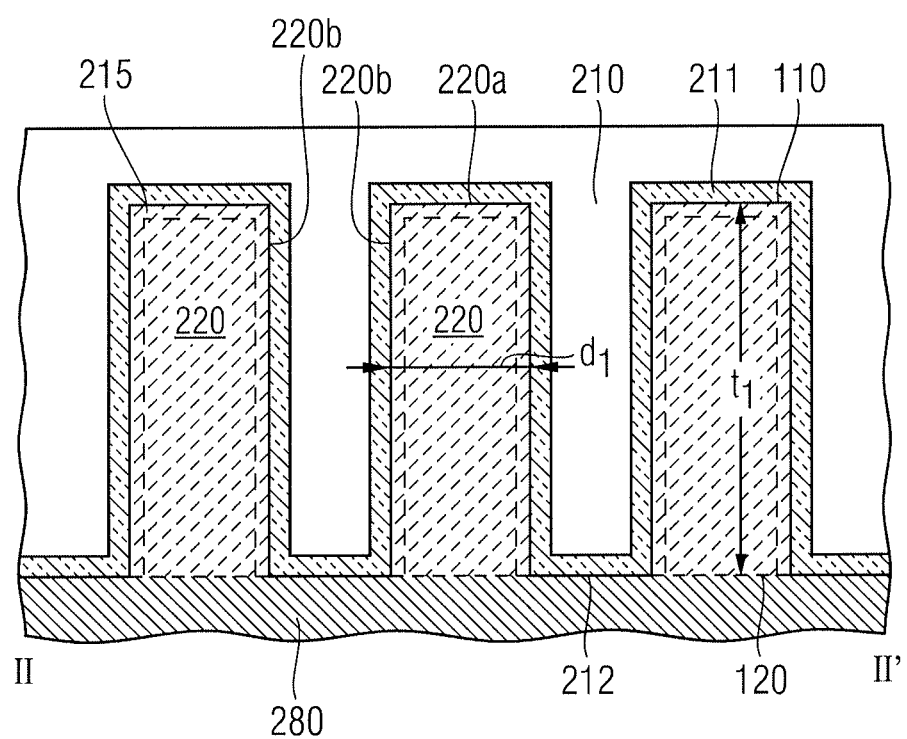
FIG. 1C shows a further cross-sectional view of the semiconductor device.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1A shows a cross-sectional view between I and I' as is also illustrated in FIG. 1B. The semiconductor device 1 comprises a transistor 10 in a semiconductor body or substrate 100 having a first main surface 110 and a second main surface 120. The first main surface 110 is opposite to the second main surface 120. The transistor 10 comprises a source region 201 at the first main surface 110, a drain region 205, a body region 220, and a drift zone 260. The transistor 10 further comprises a gate electrode 210 at the body region 220. The body region 220 and the drift zone 260 are disposed along a first direction (e.g. the x direction) between the source region 201 and the drain region 205. The first direction is parallel to the first main surface 110. The gate electrode 210 is disposed in trenches 212 extending along the first direction. The transistor further comprises an insulating layer 280 adjacent to the second main surface 120 of the semiconductor body 100. The source region 201 vertically extends to the insulating layer 280. As is illustrated by broken lines, trenches 212 are defined so as to be disposed behind and before the depicted plane of the drawing. For example, the trenches 212 may be formed in the first main surface 110 and may extend to an upper surface of the oxide layer or to the second main surface 120. Alternatively, the trenches 212 may be formed in the second main surface 120 and may extend to the first main surface 110. The body region 220 may extend from the first main surface 110 to the second main surface 120.

According to an embodiment, the semiconductor device may further comprise an insulating layer 265 which is disposed adjacent to the first main surface 110. The semiconductor layer which is sandwiched between the adjacent insulating layers 265, 280 may have a thickness of approximately less than 100 μm, e.g. 40 to 60 μm. The gate electrode 210 is disposed in the trenches 212. Further, the gate electrode 210 may be disposed over the first main surface 110. In more detail, the gate electrode 210 may be insulated from the adjacent body region 220 by means of the gate dielectric layer 211. As will be explained in more detail with reference to FIG. 1C, the gate electrode 210 may be routed over the first main surface 110 so as to be insulated from the body region 220. Further, portions of the gate electrode 210 are disposed in trenches 212.

According to an embodiment, the semiconductor device 1 may further comprise a source contact plug 267 that may be electrically connected to the source region 201 and that may be adjacent to the first main surface 110. Further, the semiconductor device may comprise a drain contact plug 277 that is electrically connected to the drain region and that may be adjacent to a second main surface 120. For example, the source contact plug 267 may be electrically connected to the source region 201 via a source contact 202. The drain contact plug 277 may be electrically connected to the drain region 205 via a drain contact 207. The drain region 205 may further comprise a heavily doped portion 206 arranged between the drain region 205 and the drain contact 207.

For example, a front side metallization layer 270 may be disposed on a side of the first main surface 110 and may be electrically connected to the source contact 202 via the source contact plug 267. Further, the semiconductor device may comprise a back side metallization layer 275 that may be electrically connected to the drain contact 207 via the drain contact plug 277. The back side metallization layer 275 may be electrically connected to a drain terminal 278.

The front side metallization layer 270 may be electrically connected to a source terminal 271.

FIG. 1B shows a horizontal cross-sectional view of the semiconductor device. For example, the cross-sectional view of FIG. 1B may be taken between IV and IV' as is also indicated in FIG. 1A. As is illustrated in FIG. 1B, the trenches 212 vertically extend in the semiconductor body 100 and run in the first direction. The trenches 212 are disposed on opposing sides of the body region 220 and pattern the body region 220 into a shape of a ridge. According to an embodiment, the gate trenches 212 may be formed in the first main surface 110 of the semiconductor body 100. A source region 201 is disposed on the left-hand side of each of the gate electrodes 210. The source regions 201 may be formed as isolated source regions, whereas the drain region 205 may be formed as a continuous stripe of correspondingly doped semiconductor material. In a similar manner, the drain contact may be implemented by a contact trench which extends in the second direction (e.g., the y direction) which is perpendicular to the first direction (e.g., the x-direction).

The source contacts may be formed as isolated contacts which are separated from each other by material of the body region 220 and body contact portions 225. Due to this arrangement, the body region 220 may be connected to a source terminal 271 via the body contact portions 225. Thereby, a parasitic bipolar transistor which could be otherwise formed at this portion may be suppressed. The distance between adjacent source regions 201 is such that an electrical connection between the body region 220 and the source contacts 202 may be accomplished. The body contact portions 225 may be disposed at the first main surface 110.

For example, the source regions 201 and the drain region 205 may be of the first conductivity type. Further, the body region 220 may be of the second conductivity type. The drift zone 260 may be of the first conductivity type, however, at a lower doping concentration than the drain region 205. The body contact portions 225 may be of the second conductivity type.

The drift zone 260 may be implemented in any suitable manner for achieving the functionality of a drift zone. When the transistor is switched on, e.g., by applying a suitable voltage to the gate electrode 210, a conductive inversion layer 215 (conductive channel) is formed at the boundary between the body region 220 and the gate dielectric 211. Accordingly, the transistor is in a conducting state from the source region 201 to the drain region 205 via the drift zone 260. In case of switching off, no conductive inversion layer is formed and the transistor is in a non-conducting state. For example, the transistor 10 may further comprise a field plate in order to deplete carriers from the drift zone when an off-voltage is applied to the gate electrode.

Due to the feature that the source region which is formed at the first main surface 110 extends to the insulating layer that is disposed adjacent to the second main surface 120 of the body region 220, the whole body region 220 may be effectively utilized for forming a conductive channel 215. As a result, an on-state resistance may be reduced. Further, due to the additional feature that the source contact plug 267 is adjacent to the first main surface 110 and the drain contact plug 277 is adjacent to the second main surface which is opposite to the first main surface, the semiconductor device implements a quasi-vertical semiconductor device.

According to a further interpretation, the semiconductor device comprises an array of transistors in a semiconductor body having a first main surface and a second main surface, the first main surface being opposite to the second main surface. For example, the transistors may be connected in parallel to each other. The transistors comprise a source region 201 at the first main surface 110, a drain region 205, a body region 220, a drift zone 260, and a gate electrode 210 at the body region 220. The body region 220 and the drift zone 260 are disposed along a first direction between the source region 201 and the drain region 205, the first direction being parallel to the first main surface. The gate electrode 210 is disposed in trenches 212 extending in the first direction. The transistors further comprise a source contact 202 in the semiconductor body for contacting the source region 201. The source contacts of adjacent transistors may be spatially separated from each other. According to an embodiment, the transistors may further comprise an insulating layer adjacent to the second main surface 120 of the semiconductor body 100. The semiconductor device may further comprise a body contact portion 225 configured to electrically connect the body region 220 to a source terminal 271. The body contact portion 225 may be disposed at the first main surface 110.

FIG. 1C shows a cross-sectional view between II and II' as is also illustrated in FIG. 1B. The cross-sectional view of FIG. 10 is taken so as to intersect the plurality of gate trenches 212. As is illustrated, separated portions of semiconductor material forming the single ridges or fins may be disposed over an insulating material 280. The ridges comprise a top surface 220a and sidewalls 220b. A gate dielectric layer 211 is disposed adjacent to the sidewalls 220b and the top surface 220a of each of the ridges. Further, a conductive material is filled in the trenches between adjacent ridges to form the gate electrode 210. As has been explained, the body region 220 has the shape of a ridge extending in the first direction or a fin. More particularly, the body region is patterned in a ridge by adjacent trenches that extend in the first direction. The gate electrode 210 may be disposed adjacent to a top surface 220a of each of the ridges. Further, the gate electrode 210 may be disposed adjacent to at least one sidewall 220b of the ridges.

The sidewalls 220b may extend perpendicularly or at an angle of more than 75° with respect to the first main surface 110. The gate electrode 210 may be disposed adjacent to at least two sides of the ridge.

In particular, the conductive channel regions 215 formed at opposing sidewalls 220b of a ridge do not merge with each other so that the body region 220 may not be fully depleted and may be connected to the source contact 202. For example, the width of the first trenches may be approximately 20-130 nm, for example, 40-120 nm along the first main surface 110 of the semiconductor body 100. Further, the distance between adjacent trenches that corresponds to the width dl of the ridges may be larger than 200 nm, e.g. larger than 0.5 μm.

Figure 1D:
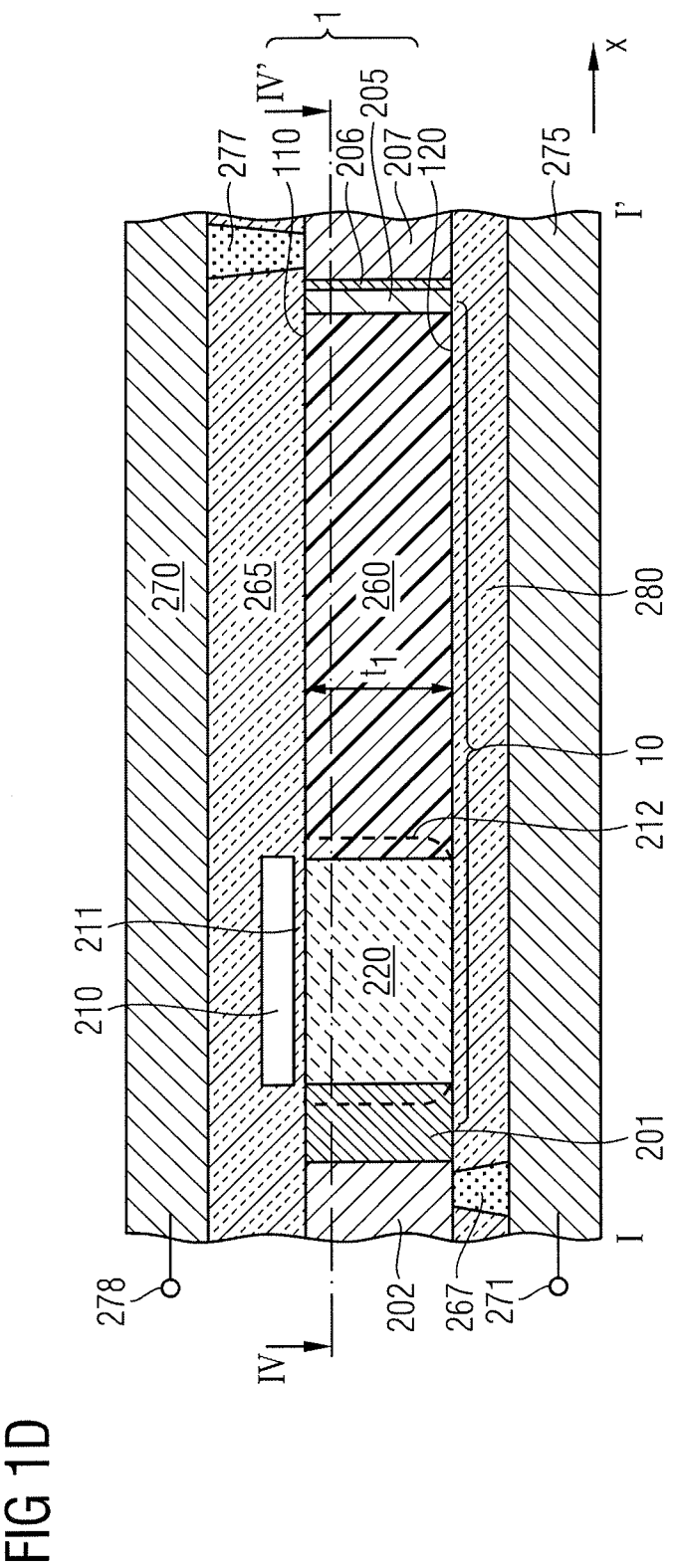
FIG. 1D shows a cross-sectional view of a semiconductor device according to a further embodiment.

FIG. 1D shows an embodiment, according to which the source contact plug 267 is disposed adjacent to the second main surface 120. Further, the drain contact plug 277 is disposed adjacent to the first main surface 110. For example, the source contact plug 267 may be electrically connected to the source region 201 via a source contact 202. The drain contact plug 277 may be electrically connected to the drain region 205 via a drain contact 207. The drain region 205 may further comprise a heavily doped portion 206 arranged between the drain region 205 and the drain contact 207.

For example, a front side metallization layer 270 may be disposed on a side of the first main surface 110 and may be electrically connected to the drain contact 207 via the drain contact plug 277. Further, the semiconductor device may comprise a back side metallization layer 275 that may be electrically connected to the source contact 202 via the source contact plug 267. The back side metallization layer 275 may be electrically connected to a source terminal 271. The front side metallization layer 270 may be electrically connected to a drain terminal 278. The gate electrode 210 may be routed over the first main surface 110 and may be insulated from the body region 220. Further, portions of the gate electrode 210 are disposed in trenches 212.

Figure 2:
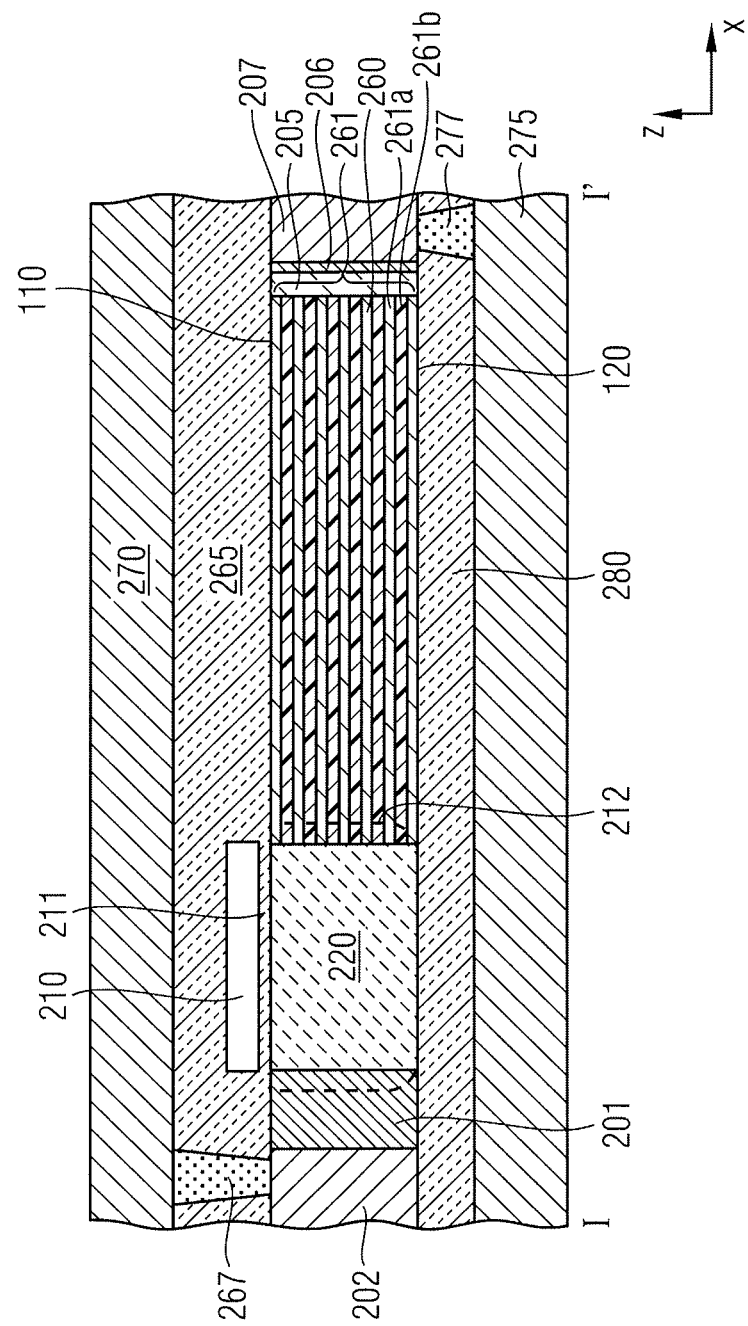
FIG. 2 shows a cross-sectional view of a semiconductor device according to a further embodiment.

FIG. 2 shows a cross-sectional view of a semiconductor device according to a further embodiment. In FIG. 2, the same reference numerals as those illustrated in FIG. 1A designate the same components. Differing from the embodiment of FIG. 2, the drift zone 260 may comprise a superjunction layer stack. For example, the superjunction layer stack may comprise n-doped and p-doped layers stacked in a stack direction (e.g., z direction) in an alternating manner, the stack direction being perpendicular with respect to the first main surface 110. In more detail, the superjunction layer stack 261 may comprise a sequence of doped single-crystalline semiconductor sub-layers 261a, 261b having a reverse polarity. For example, a p-doped sub-layer 261a may be followed by an n-doped sub-layer 261b and vice versa. For example, the superjunction layer stack 261 may comprise at least two p-doped sub-layers 261a or at least two n-doped sub-layers 261b. The doping concentration of the source and drain regions 201, 205 may be higher than a doping concentration of the sub-layers 261a, 261b constituting the drift zone 260.

In so-called compensation devices comprising a superjunction layer stack, in case an off-voltage is applied to the transistors, a current flow can be effectively blocked since charge carriers of adjacent sub-layers, each having a different doping type, compensate each other. As a consequence, adjacent p and n doped regions are caused to fully deplete in an off-state. Accordingly, for achieving similar breakdown characteristics as a conventional device, the doping concentration of the doped layers may be increased, resulting in a reduced resistivity in an on-state. In a superjunction layer stack, the thickness of each of the sub-layers may be selected so that in a case of an off-voltage, the sub-layers may be fully depleted.

According to an embodiment, the sub-layers 261a, 261b extend in the first direction. For example, the sub-layers 261a, 261b may be stacked in a stack direction which is perpendicular to the first main surface 110. Alternatively, the sub-layers 261a, 261b may be stacked in a stack direction which is parallel to the first main surface 110. For example, the superjunction layer stack 261 may have a thickness of at least 1 μm.

When a suitable voltage is applied to the gate electrode 210, the conductivity of a conductive channel 215 that is formed in the body region 220 will be controlled by the gate voltage. By controlling the conductivity of the conductive channel 215 formed in the body region 220, the current flow from the source region 201 via the channel region formed in the body region 220 and the drift zone 260 to the drain region 205 may be controlled. When a voltage corresponding to an off-state is applied to the gate electrode 210, no conductive channel is formed at the boundary between the body region 220 and the insulating gate dielectric material 211 so that no current flows. Further, the sub-layers of the superjunction layer stack 261 are fully depleted so that a current flow is prevented and the device has a high voltage blocking characteristic.

In the following, a method for forming the semiconductor device according to an embodiment will be described in more detail. Starting material may be an SOI substrate 105 as illustrated in FIG. 3A, comprising a silicon substrate 107, a buried oxide layer 280 and a thin monocrystalline silicon layer 101 on top of the buried oxide layer 280. Optionally, implantation steps for doping the silicon substrate 107 may be performed. Thereafter, a multilayer epitaxial method may be performed so as to form a superjunction layer stack 261 over the buried oxide layer 280. FIG. 3B shows an example of a resulting structure. For example, this may be accomplished by an epitaxial method which changes the doping type for every new sub-layer. Alternatively, after depositing a certain layer, an implantation step may be performed so as to correspondingly dope the sub-layer.

After forming the superjunction layer stack 261, a silicon oxide layer 263 may be formed over the top surface of the superjunction layer stack 261, followed by several layers of materials for forming a hard mask 310. Thereafter, a lithographic step may be performed so as to define an opening in the hard mask layer stack including the silicon oxide layer 263.

Figure 3C:
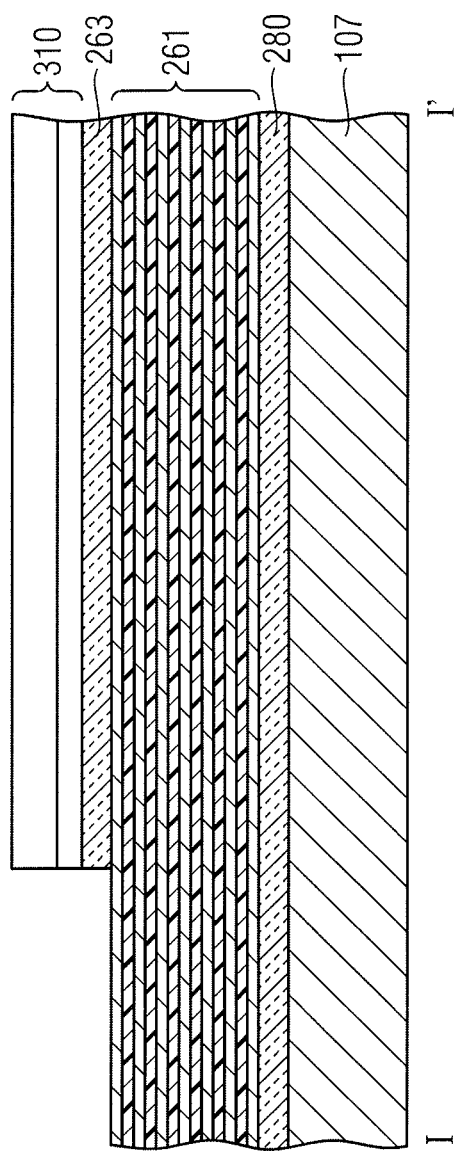

FIG. 3C shows an example of a cross-sectional view. Then, an etching step may be performed so as to etch the uncovered portions of the superjunction layer stack 261. This etching step may stop on the bottom or lowermost silicon layer 311 which may be p-doped.

The left-hand side of FIG. 3D shows a cross-sectional view of an example of a substrate after performing the step. The right-hand side of FIG. 3D shows a horizontal cross-sectional view of the substrate. As is shown, the body trench 312 is defined in the epitaxial layer stack 261.

Thereafter, silicon is epitaxially grown in the region of the body trench 312. For example, this may be accomplished by performing a selective epitaxial growth, in which, e.g., doping may be in-situ performed. For example, the grown semiconductor material 320 may be p-doped. Optionally, a CMP step may be performed in order to obtain a smooth surface. Optionally, epitaxial material may be recessed. Further, due to the CMP step, semiconductor material is prevented from growing over the silicon oxide layer 263.

Figure 3E:
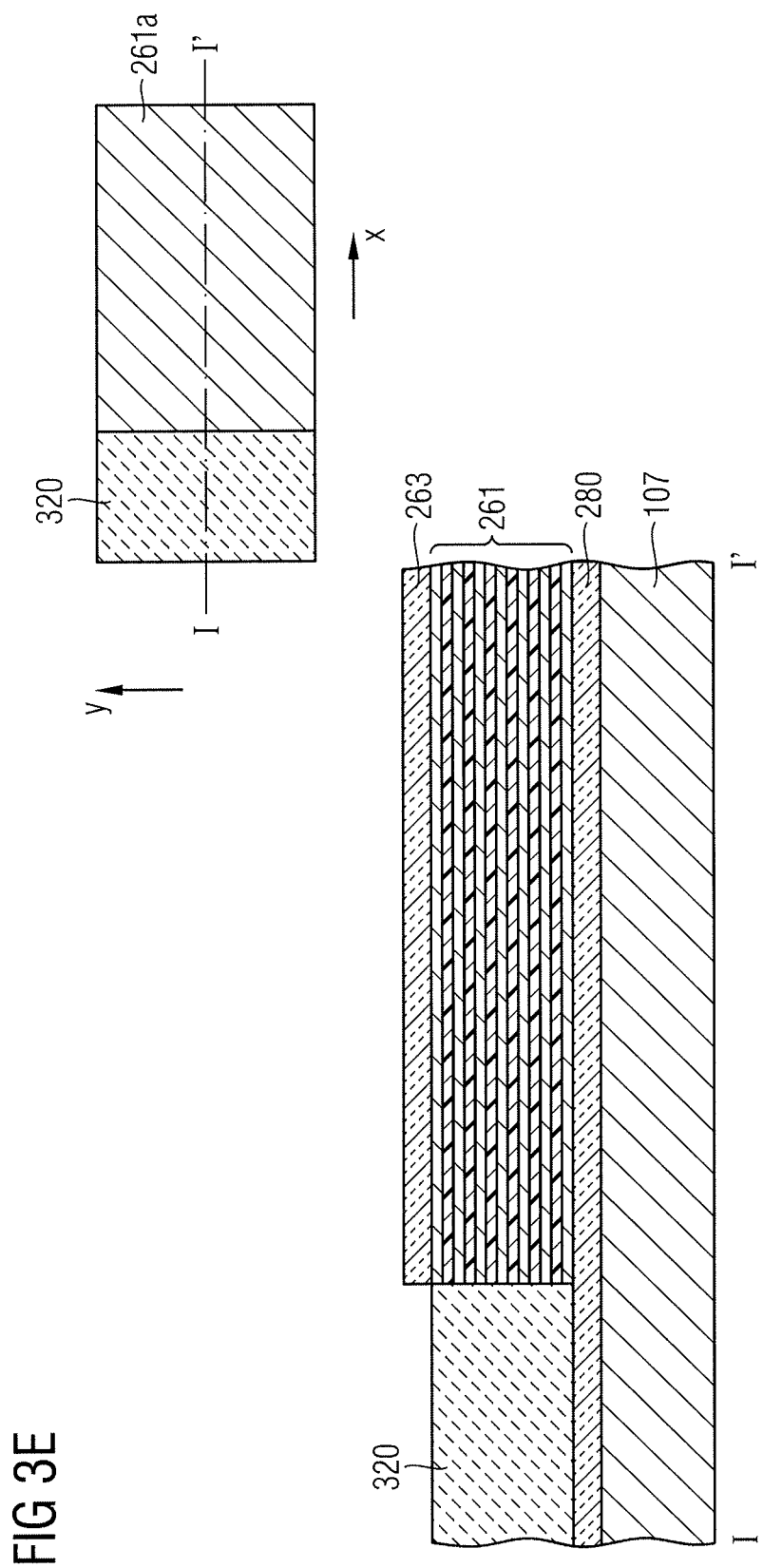

FIG. 3E shows an example of a resulting structure. The right-hand side of FIG. 3E shows a horizontal cross-sectional view. As is shown, a trench extending in the Y-direction (second direction) is filled with the material of the body region 320.

The left-hand portion of FIG. 3E shows a vertical cross-sectional view. Thereafter, a further silicon oxide layer and hardmask layer 330 may be formed on top of the resulting surface. Further, an opening 335 for defining the gate trenches may be defined in the silicon oxide layer 263 and the hardmask layer stack 330.

Figure 3F:
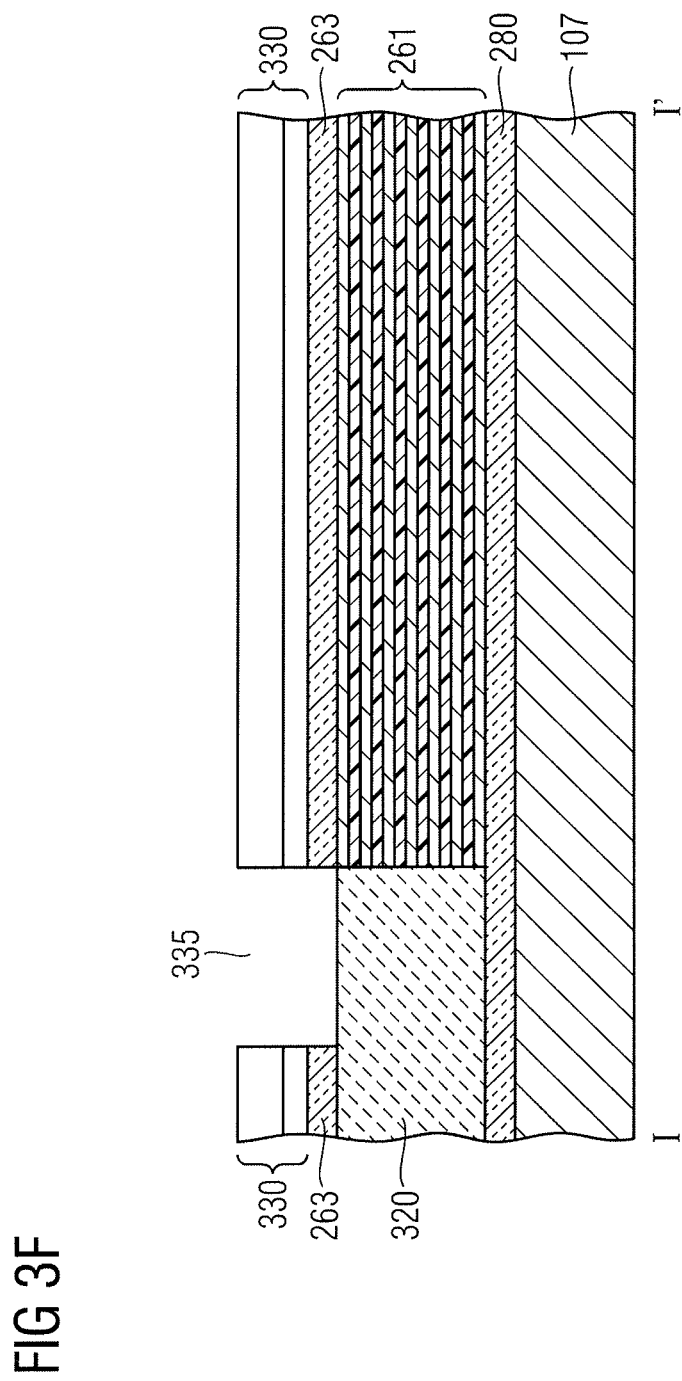

FIG. 3F shows an example of a resulting structure. Thereafter, the gate trenches 336 are defined in the material of the body region 320. The gate trenches 336 may be photolithographically defined. An etching step for etching the trenches into the material of the body region 320 may be performed. Further, an oxidation step may be performed so as to form a gate dielectric layer (not shown).

Figure 3G:
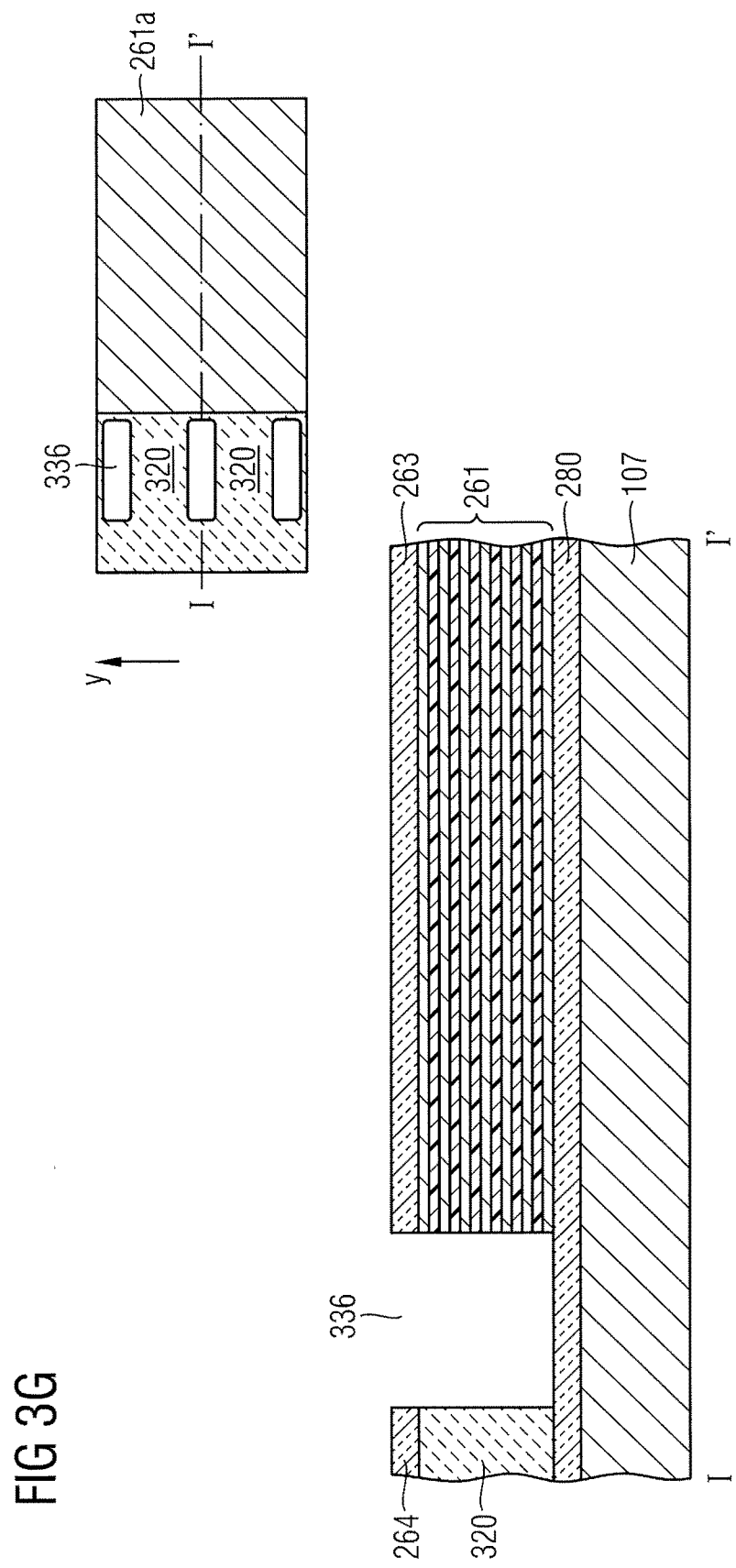

FIG. 3G shows on the left-hand side, a cross-sectional view between I and I'. As is shown, a gate trench 336 is defined so as to extend to the top surface of the buried oxide layer 280. The right-hand portion of FIG. 3G shows a horizontal cross-sectional view. As is shown, a plurality of gate trenches 336 is formed.

After forming the gate dielectric layer, a conductive material for forming the gate electrode is filled in the trenches. For example, this may be accomplished by depositing polysilicon. For example, the deposited polysilicon may be in-situ n-doped. A lithographic method may be performed so as to remove the deposited conductive material from unwanted regions.

Figure 3H:
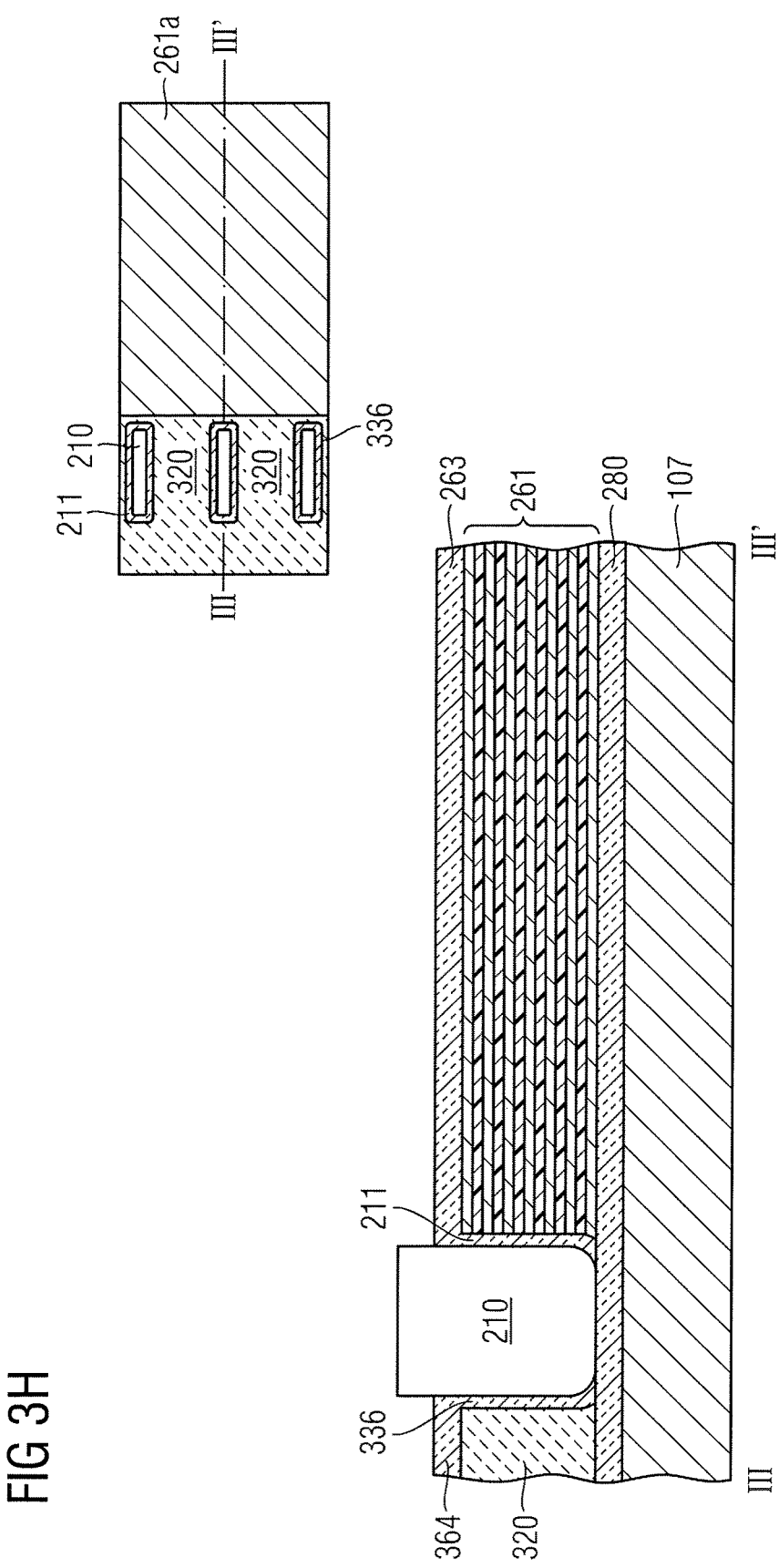

FIG. 3H shows a cross-sectional view of a resulting structure. The right-hand side of FIG. 3H shows a horizontal cross-sectional view. As is shown, a plurality of gate trenches 212 is formed. A gate dielectric layer 211 is disposed at sidewalls of each of the trenches 336. The trenches 336 are filled with a gate conductive material to form the gate electrode 210.

Thereafter, a further silicon oxide layer 265 may be formed over the surface of the resulting structure. Optionally, a CMP ("chemical mechanical polishing") step may be performed so as to obtain a smooth surface. Then, a drain contact trench 322 for forming the drain contacts may be defined. Further, a plurality of source contact opening 321 may be disposed on a left-hand side of the gate electrode to form the source contacts. The source contact openings 321 may have an approximately rectangular cross-sectional shape. In particular, each of the source contact openings 321 has a sidewall on a side of the gate electrode 210 and a sidewall roughly extending parallel to the first direction. The size of the source contact trenches 321 should be such that a tilted implantation step for doping in the first direction as well as in the second direction may be accomplished.

Figure 3I:
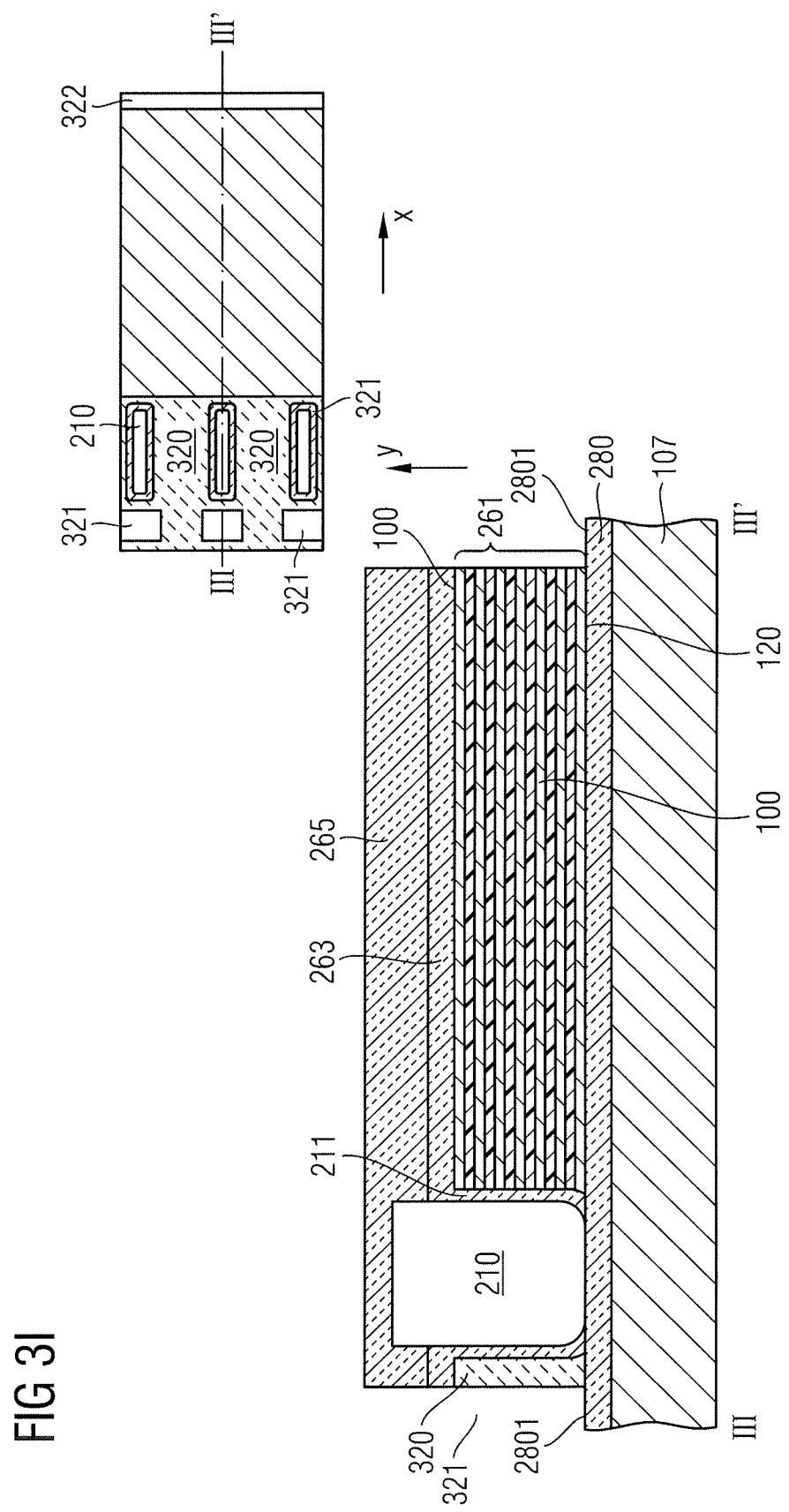

FIG. 3I shows an example of a resulting structure. The left-hand portion of FIG. 3I shows a cross-sectional view between III and III' so as to intersect the gate electrode 210. As is shown, the drain contact trenches 322 extend to an upper surface of the buried oxide layer 280. Likewise, the source contact openings 321 extend to the upper surface 2801 of the buried oxide layer 280. As is further shown in the horizontal cross-sectional view in the right-hand side of FIG. 3I, each of the source contact openings 321 is assigned to one of the gate electrodes 210, respectively.

Thereafter, tilted ion implantation steps are performed so as to provide doped portions adjacent to the sidewalls of the source contact opening 321. For example, a tilted ion implantation step may be performed for providing the source regions 201. The source regions 201 may be doped with the first conductivity type. For example, this may be accomplished by doping n-type dopants through the sidewalls of the contact openings 321. This implantation step may be performed as a so-called "dual mode" implantation step in which a first implantation step is performed and thereafter, the substrate is tilted by 180° so as to dope the opposite side adjacent to the source contact opening 321. Further, the substrate may be rotated by 90° so as to dope the body contact portions 225 which are arranged along the second direction. The body contact portions may be doped with the second conductivity type, e.g. by doping with p-type dopants. Also the body contact portions 225 may be doped by a dual mode implantation step. Thereafter, a metal filling may be formed in the source contact openings 321, followed by an etching step. For example, a combination of Ti/TiN may be filled on the sidewalls of the openings, followed by tungsten. FIGS. 4A to 4C show various views of an example of a resulting structure.

FIG. 4A shows a horizontal cross-sectional view of the semiconductor device. As is shown, source regions 201 are arranged along the first direction with respect to the source contact opening, whereas the body contact portions 225 are arranged along the second direction with respect to the source contact openings 321. Further, the body contact portions 225 of adjacent transistor cells may be separated from each other. The source regions 201 are disposed between the source contact opening 321 and the gate electrode 210. The source region 201 is insulated from the gate electrode 210 by means of the gate dielectric 211. A body region 320 is disposed between adjacent gate electrodes 210. The drift zone comprising an epitaxial layer 261a is disposed between the body region 320 and the drain region 205. The drain region 205 is formed as a continuous line. Likewise, the drain contact 207 may be formed as a continuous line. FIG. 4B shows an enlarged view of the source contact, the body contact portion 225 and the gate electrode. Further, the body region 220 in which a conductive channel 215 is formed upon application of a suitable gate voltage to the gate electrode 210 is specifically illustrated.

FIG. 4C shows an example of a cross-sectional view between III and III' as is illustrated in FIG. 4A. The cross-sectional view is taken so as to intersect the gate electrode 210. Behind and before the depicted plane of the drawing, the body region 320 is disposed. As is shown, the source contact 202 extends from the first main surface 110 to the second main surface 120. Further, the source region 201 extends from the first main surface 110 to the second main surface 120. In a similar manner, the drain region 205 extends from the first main surface 110 to the second main surface 120. Further, the drain contact 207 extends from the first main surface to the second main surface.

FIGS. 5A to 5D illustrate further steps of manufacturing further components of the semiconductor device. Optionally, a further silicon oxide layer may be deposited so as to cover the drain region. Optionally, a CMP step may be performed so as to thin the silicon oxide layer. Thereafter, a photolithographic step may be performed so as to define an opening form forming a source contact plug 267. Then, a metal may be filled into the opening, followed by an etching step for etching back the metal filling. By way of example, the metal filling may comprise Ti/TiN and tungsten. Then, the front side metallization layer 270 may be formed on top of the oxide layer 265. Optionally, the front side metallization layer 270 may be further patterned.

Figure 5A:
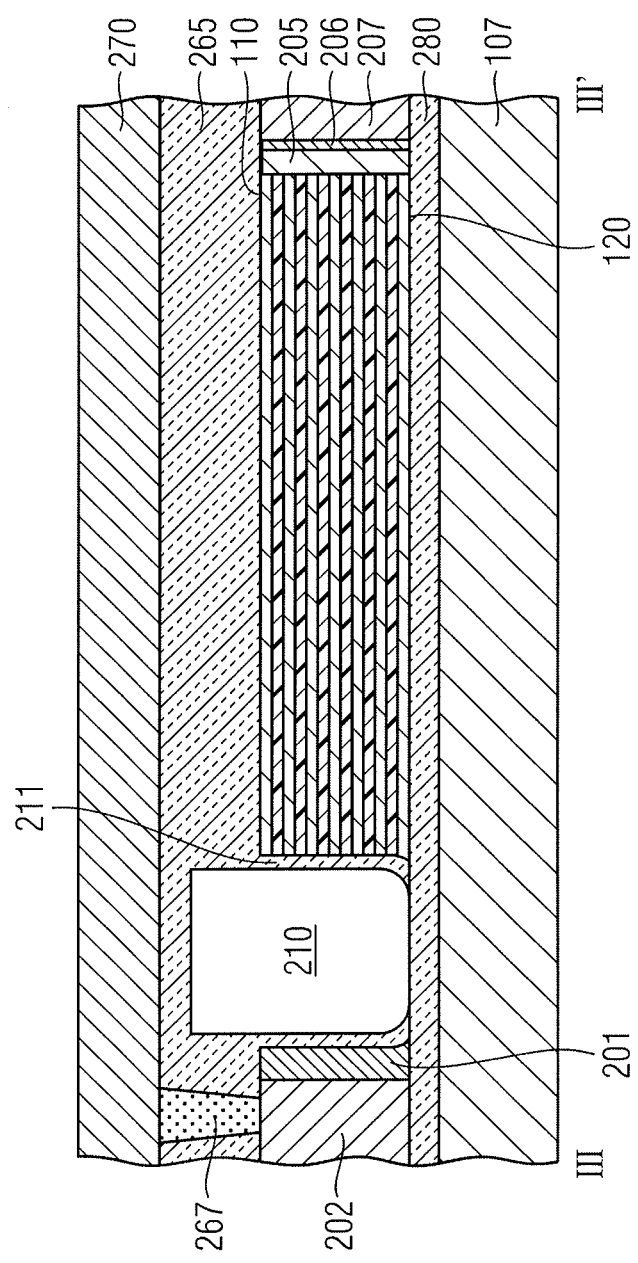

FIG. 5A shows an example of a resulting structure. As is shown, a source contact plug 267 is formed so as to electrically connect the source contact 202 to the front side metallization layer 270. Thereafter, further processing steps for processing the back side of the work piece are performed. The work piece may be mounted to a carrier 500 so that the front side metallization layer 270 is adjacent to the carrier 500. The wafer is thinned from the back side so as to remove the silicon substrate 107. The thinning is performed so as to stop on top of the oxide layer 280.

Figure 5B:
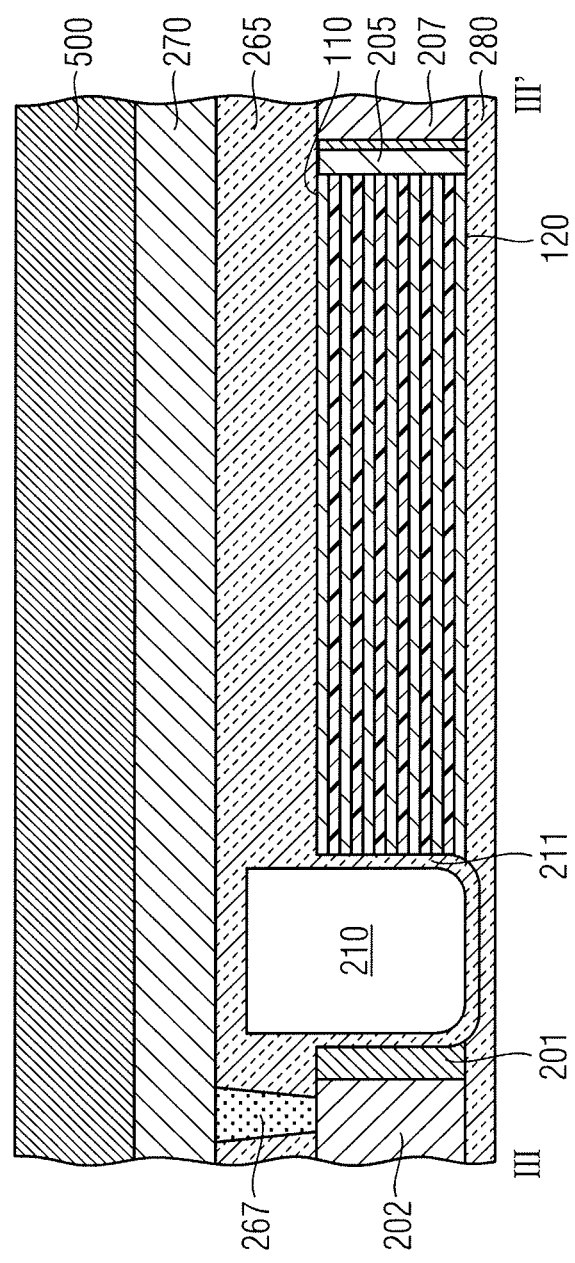

FIG. 5B shows an example of a resulting structure. As is shown, now, the back side of the oxide layer 280 is uncovered. Thereafter, a further oxide layer 280b is formed on the surface of the oxide layer 280. Contact openings are defined for forming a drain contact plug 277. A metal, e.g., Ti/TiN and tungsten may be filled in the contact opening, followed by an etch-back step. Thereafter, a back side metallization layer 275 is formed over the oxide layer 280b. Thereafter, the carrier 500 is removed from the front side metallization layer 270. As a result, the drain contact 207 is connected via the drain contact plug 277 to the back side metallization layer 275.

FIG. 5C shows an example of a resulting structure. The cross-sectional view of FIG. 5C is taken between III and III' as is also illustrated in the right-hand side of FIG. 5C. In particular, this cross-sectional view is taken so as to intersect the gate electrode 210.

Figure 5D:
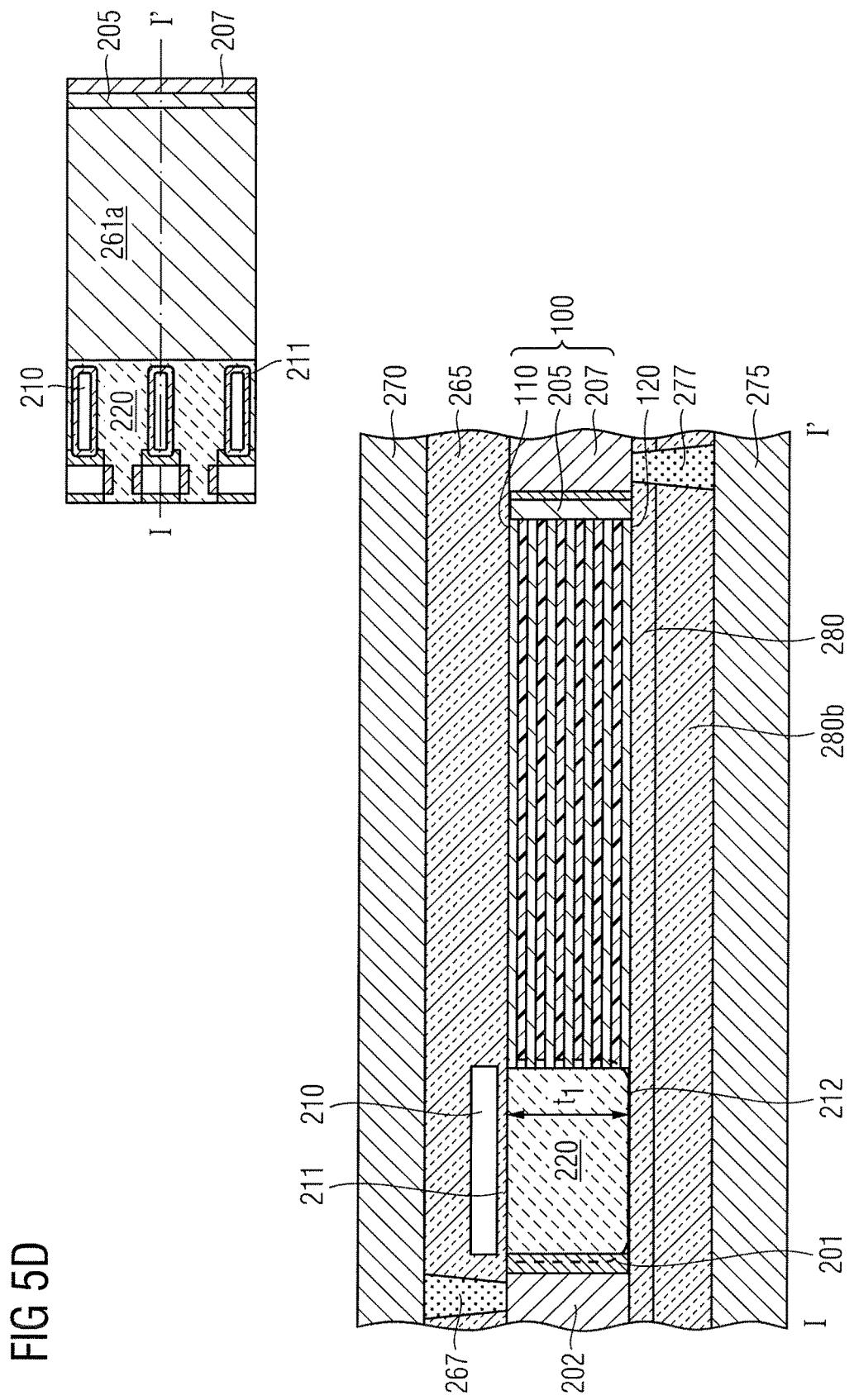

The left-hand portion of FIG. 5D shows a cross-sectional view which is taken between I and I' so as to intersect the body region 220. As is shown, the body region 220 extends from the first main surface 110 to the second main surface 120 and is contacted to the source region 201 over the whole extension depth $t_1$. The position of the gate trenches 212 is indicated by dotted lines. Likewise, the gate electrode 212 extends along the whole depth $t_1$ of the body region 220. On the other side, the drain region 205 extends from the first main surface to the second main surface so that the effective channel width of the transistor is mainly determined by the depth $t_1$ of the semiconductor body 100. The source contact plug 267 is disposed at the first main surface, whereas a drain contact plug 277 is disposed at the second main surface. As is to be clearly understood, the source contact plug 267 and the drain contact plug 277 both may be disposed at the first main surface 110 or at the second main surface 120. Likewise, the source contact plug 267 may be disposed at the second main surface 120, whereas the drain contact plug 277 is disposed at the first main surface 110. The semiconductor device 1 implements an approximately symmetric device. All components with the exception of the gate electrode 210 are arranged in a symmetric manner around the horizontal axis of the transistor.

The semiconductor device 1 comprises a plurality of single transistors 10 which may be connected in parallel. The pattern of the single transistors 10 may be repeated and mirrored along the first and the second directions.

According to a modification of the manufacturing method described above, the semiconductor device 1 may be formed without the superjunction layer stack. According to this modification, the body region 220 may be defined by performing an ion implantation process.

Figure 6:
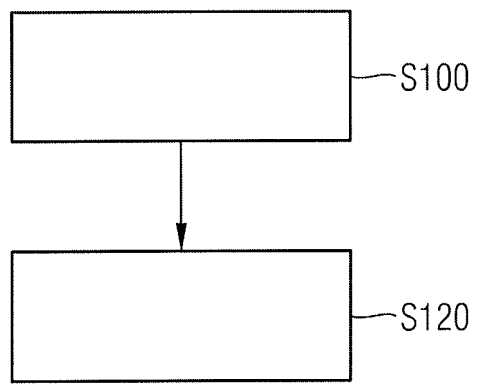
FIG. 6 summarizes a method according to an embodiment.

FIG. 6 summarizes a method of manufacturing a semiconductor device. As is shown, a method of manufacturing a semiconductor device comprising forming a transistor in a semiconductor body having a first main surface and a second main surface, the first main surface being opposite to the second main surface. Forming the transistor comprises forming a source region, forming a drain region, forming a body region, and forming a drift zone, forming a gate electrode and patterning the body region into a shape of a ridge extending along the first direction by adjacent trenches extending in the first direction (S100). The method further comprises forming an insulating layer (S120) adjacent to the second main surface of the body region, wherein the source region vertically extends to the insulating layer.

As has been discussed in the foregoing, due to the fact that the contacts are disposed on opposite sides of the device, the semiconductor device may be integrated in various applications.
Further, the current of the semiconductor device which is controlled by means of a voltage applied to the gate electrode flows in a lateral direction, i.e. parallel to the first main surface of the semiconductor body. Since the contacts are disposed on opposite surfaces of the semiconductor body, the resulting current flows in a vertical direction. Due to this configuration, the semiconductor device may be integrated to form an integrated circuit such as a half-bridge switch. Further examples comprise a full bridge, a voltage regulator, a rectifier, or a power supply.

Figure 7:
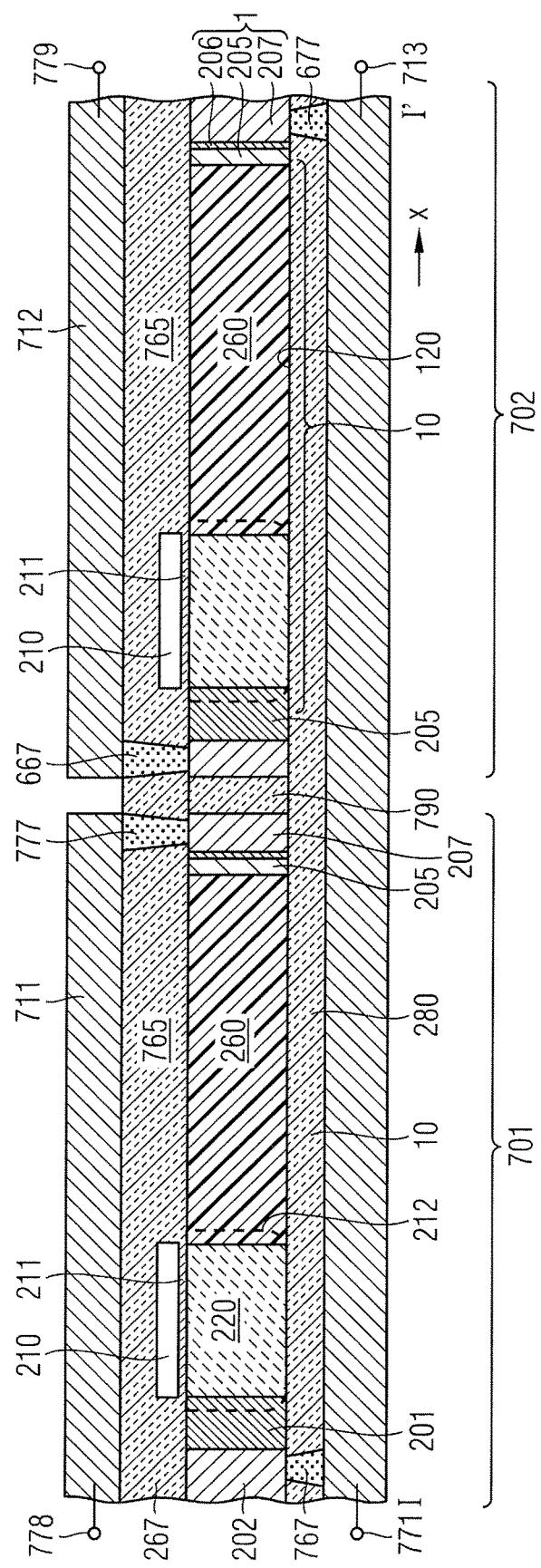
FIG. 7 illustrates an example of an integrated circuit according to an embodiment.

FIG. 7 illustrates an example of an integrated circuit comprising a first transistor 701 and a second transistor 702. The first transistor 701 and the second transistor 702 comprise the same or similar components as the transistors illustrated in FIGS. 1A to 1D. The first transistor 701 may comprise a first source contact 767 that is adjacent to the second main surface 120 of the semiconductor body 100. Further, the first transistor 701 comprises a first drain contact 777 that is disposed at the first main surface 110. The first source contact 767 is connected to the source region 201 of the first transistor 701, and the first drain contact 777 is connected to the drain region 205 of the first transistor 701.

A second transistor 702 comprises approximately the same components as the first transistor 701. The second transistor 702 may be formed in the same semiconductor body 100 as the first transistor 701. The second transistor 702 is insulated from the first transistor 701 by means of an isolation structure 790. For example, the isolation structure 790 may comprise an insulating material and, optionally, a conductive filling that is insulated from the adjacent semiconductor material. For example, the isolation structure 790 may be formed by forming a trench in the semiconductor body and forming the respective insulating and conductive materials in this trench. For example, the trench defining the isolation structure 790 may be formed concurrently with trenches defining the gate electrode trenches 212.

The second source contact 667 is electrically connected to the source region 201 of the second transistor 702. For example, the second source contact 667 may be disposed at the first main surface 110 of the semiconductor body 100. Further, the second drain contact 677 is connected to the drain region 205 of the second transistor 702. The second drain contact 677 may be disposed at the second main surface 120 of the semiconductor body 100. The integrated circuit shown in FIG. 7 further comprises a front side dielectric material 765 and a front side metallization. For example, the front side metallization may comprise a front side drain metallization 711 and a front side source metallization 712. Further, the integrated circuit may comprise a back side metallization 713 that is connected with the source region 201 of the first transistor 701 and the drain region 205 of the second transistor 702. The back side metallization 317 may be insulated from the second main surface of the semiconductor body 100 by means of a back side dielectric layer 280.

For example, the front side metallization layer 711 may be connected with a terminal 778 that may be held at a VS ("supply voltage") potential. Further the front side metallization layer 712 may be connected with a terminal 779 that may be grounded. In addition, the back side metallization 713 may be connected with a phase terminal 771. For example, a bipolar load (such as a motor) may be connected to the phase. In this configuration, the motor may be provided with forward and backward current. Accordingly, the integrated circuit shown in FIG. 7 implements an integrally formed half-bridge switch that may be used for buck converters, for example.

The specific interconnection scheme of FIG. 7 is given as an example. According to further embodiments, the first source contact 767 and the second source contact 667 may be adjacent to the first main surface 110 of the semiconductor body, and the first drain contact 777 and the second drain contact 677 may be adjacent to the second main surface 120 of the semiconductor body or vice versa. The first and the second source contacts 767, 667 may be electrically connected to a common metallization and may, consequently, be connected to each other. The first drain contact 777 and the second drain contact 677 may be electrically connected to different terminals. Alternatively, the first drain contact 777 and the second drain contact 677 may be electrically connected to a common metallization and may, consequently, be connected to each other. In this case, the first source contact 767 and the second source contact 667 may electrically connected to different terminals. According to these embodiments, the integrated circuit may implement a reverse blocking switch.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a transistor in a semiconductor body having a first main surface and a second main surface, the first main surface being opposite to the second main surface, the transistor comprising:
    a source region at the first main surface and extending to the second main surface;
    a drain region;
    a body region;
    a drift zone;
    a gate electrode at the body region, the body region and the drift zone being disposed along a first direction between the source region and the drain region, the first direction being parallel to the first main surface, the gate electrode being disposed in trenches extending in the first direction, and
    an insulating layer adjacent to the second main surface of the semiconductor body.

2. The semiconductor device according to claim 1, wherein the drift zone comprises a superjunction layer stack.

3. The semiconductor device according to claim 1, further comprising a body contact portion configured to electrically connect the body region to a source terminal, the body contact portion being disposed at the first main surface.

4. The semiconductor device according to claim 1, wherein the trenches are formed in the first main surface.

5. The semiconductor device according to claim 1, wherein the drift zone is sandwiched between the insulating layer and a further insulating layer adjacent to the first main surface.

6. The semiconductor device according to claim 1, further comprising:
    a source contact plug electrically connected to the source region, the source contact plug being adjacent to the first main surface; and
    a drain contact plug electrically connected to the drain region, the drain contact plug being adjacent to the second main surface.

7. The semiconductor device according to claim 1, further comprising:
    a source contact plug electrically connected to the source region, the source contact plug being adjacent to the second main surface; and
    a drain contact plug electrically connected to the drain region, the drain contact plug being adjacent to the first main surface.

8. The semiconductor device according to claim 7, further comprising a back side metallization layer adjacent to the second main surface and being insulated from the gate electrode by means of the insulating layer, the back side metallization layer being connected with the drain contact plug.

9. The semiconductor device according to claim 7, further comprising a front side metallization layer adjacent to the first main surface and being insulated from the gate electrode by means of a further insulating layer, the front side metallization layer being connected with the source contact plug.

10. The semiconductor device according to claim 1, wherein a distance between the first main surface and the second main surface is less than 100 μm.

11. The semiconductor device according to claim 1, wherein the drain region is disposed at the first main surface.

12. An integrated circuit comprising the semiconductor device according to claim 1.

13. The integrated circuit according to claim 12, further comprising a first source contact electrically connected to the source region, the first source contact being adjacent to the second main surface,
    a first drain contact electrically connected to the drain region, the first drain contact being adjacent to the first main surface, and
    a second semiconductor device, the second semiconductor device comprising a second source region and a second drain region, a second source contact electrically connected to the second source region, the second source contact being adjacent to the first main surface; and
    a second drain contact electrically connected to the second drain region, the second drain contact being adjacent to the second main surface.

14. The integrated circuit according to claim 12, being selected from the group of a switch, a full-bridge, a half-bridge, a control circuit, a voltage regulator and a power supply.

15. A method of manufacturing a semiconductor device comprising a transistor in a semiconductor body having a first main surface and a second main surface, the first main surface being opposite to the second main surface, the method comprising:
    forming a source region at the first main surface, the source region extending to the second main surface;
    forming a drain region;
    forming a body region;
    forming a drift zone;
    forming a gate electrode at the body region, the body region and the drift zone being disposed along a first direction between the source region and the drain region, the first direction being parallel to the first main surface,
    wherein forming the gate electrode comprises forming trenches extending in the first direction, and
    forming an insulating layer adjacent to the second main surface of the semiconductor body.

16. The method according to claim 15, wherein forming the source region comprises forming an opening in the semiconductor body and performing a tilted ion implantation step via a sidewall of the opening, thereby doping a semiconductor portion adjacent to the opening.

17. The method according to claim 16, further comprising forming a body contact portion at the first main surface, wherein forming the body contact portion comprises a tilted ion implantation process of doping via a second sidewall of the opening, the second sidewall being disposed on a side of the opening in a direction perpendicularly with respect to the first direction.

18. The method according to claim 15, wherein forming the drift zone comprises forming a superjunction layer stack.

19. The method according to claim 18, wherein the body region is formed after forming the superjunction layer stack.

20. The method according to claim 19, wherein forming the body region comprises removing a portion of the super-junction layer stack and performing a selective epitaxy method.

21. The method according to claim 15, further comprising forming a body contact portion at the first main surface.

22. The method according to claim 15, wherein the method comprises using an SOI-substrate comprising a buried oxide layer as a starting material, wherein the buried oxide layer implements the insulating layer.

* * * * *